US008987388B2

(12) United States Patent
Swier et al.

(10) Patent No.: US 8,987,388 B2
(45) Date of Patent: Mar. 24, 2015

(54) HIGH GLASS TRANSITION TEMPERATURE RESIN FORMULATIONS

(71) Applicant: Dow Corning Corporation, Midland, MI (US)

(72) Inventors: Steven Swier, Midland, MI (US); John Horstman, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 14/352,741

(22) PCT Filed: Oct. 31, 2012

(86) PCT No.: PCT/US2012/062726
§ 371 (c)(1),
(2) Date: Apr. 18, 2014

(87) PCT Pub. No.: WO2013/066965
PCT Pub. Date: May 10, 2013

(65) Prior Publication Data
US 2014/0288245 A1      Sep. 25, 2014

Related U.S. Application Data

(60) Provisional application No. 61/554,160, filed on Nov. 1, 2011.

(51) Int. Cl.
| | | |
|---|---|---|
| C08L 79/04 | (2006.01) | |
| C08L 83/06 | (2006.01) | |
| C07F 7/18 | (2006.01) | |
| H01L 23/29 | (2006.01) | |
| C08G 77/388 | (2006.01) | |
| C08G 77/458 | (2006.01) | |

(52) U.S. Cl.
CPC .............. C08L 79/04 (2013.01); C08L 83/06 (2013.01); H01L 23/296 (2013.01); C08G 77/388 (2013.01); C08G 77/458 (2013.01)
USPC ................ 525/474; 106/287.1; 106/287.13

(58) Field of Classification Search
None
See application file for complete search history.

(56) References Cited

U.S. PATENT DOCUMENTS

| | | | | |
|---|---|---|---|---|
| 5,260,398 | A * | 11/1993 | Liao et al. .................. | 528/15 |
| 7,211,638 | B2 * | 5/2007 | Jayaraman ................. | 528/25 |
| 2010/0193961 | A1 * | 8/2010 | Konishi et al. ............ | 257/773 |
| 2011/0223420 | A1 * | 9/2011 | Ichiroku .................... | 428/355 EP |
| 2013/0136930 | A1 * | 5/2013 | Kato et al. ................. | 428/418 |

OTHER PUBLICATIONS

Liang et al. "Synthesis, Morphology, and Viscoelastic Properties of Cyanate Ester/Polyhedral Oligomeric Silsesquioxane Nanocomposites" Journal of Polymer Science: Part A: Polymer Chemistry, vol. 43, 3887-3898, 2005.*
Liang et al. "Cyanate Ester/Polyoctahedral Oligomeric Silsesquioxane (POSS) Nanocomposites: Synthesis and Characterization" Chem. Mater. 2006, 18, 301-312.*
Gnanasekaran et al. "Developments of polyhedral oligomeric silsesquioxane (POSS), POSS nanocomposites and their applications: A review" Journal of Scientific & Industrial Research, vol. 68, 2009, 437-464.*

\* cited by examiner

*Primary Examiner* — Robert S Loewe
(74) *Attorney, Agent, or Firm* — Brinks Gilson & Lione

(57) ABSTRACT

A curable resin formulation based on the modification of cyanate esters with silsesquioxane resins is provided for use in forming a cured composite structure or layer. More specifically, a resin formulation that generally comprises a silsesquioxane resin component having an equivalent weight of aromatic hydroxyl groups that is greater than 500 and less than 2,000 grams per mole of aromatic hydroxyl groups; a cyanate ester component; and optionally a catalyst is described. In this resin formulation, the silsesquioxane resin component is present in an amount greater than 10 wt. % of the total solids content of the resin formulation. The resin composite layer formed therefrom exhibits a glass transition temperature that is greater than or equal to 185° C., wherein this glass transition temperature decreases by less than or equal to 40% upon exposure to water at an elevated temperature for a predetermined amount of time.

26 Claims, No Drawings

US 8,987,388 B2

HIGH GLASS TRANSITION TEMPERATURE RESIN FORMULATIONS

CROSS REFERENCE TO RELATED APPLICATIONS

This application is the National Stage of International Application Ser. No. PCT/US2012/062726 filed Oct. 31, 2012, designating the United States and published in English, which claims the benefit of the filing date under 35 U.S.C. §119(e) of U.S. Provisional Application No. 61/554,160 filed Nov. 1, 2011, the entire contents of each of which are hereby incorporated herein by reference.

FIELD

This disclosure relates generally to resin formulations that exhibit a high glass transition temperature, dielectric characteristics, water resistance, and thermal-hydrolytic stability. More specifically, this disclosure relates to siloxane-modified cyanate ester formulations and method of making, as well as their use as a binder system for printed circuit board (PCB) applications.

BACKGROUND

The statements in this section merely provide background information related to the present disclosure and may not constitute prior art.

The triazine network structure formed upon curing cyanate ester materials exhibits a balance of flexibility, low dielectric loss, low moisture pick-up, and thermal stability in the absence of water that makes these materials suitable for use in high-end microelectronics packaging, multi-layer circuit boards and aerospace composite applications. Currently, cyanate ester materials are used for the lamination of substrates in high density, high speed multi-layer electronic boards.

However, in addition to several useful properties, cyanate ester chemistry also exhibits multiple drawbacks or limitations. A summary of the advantages and disadvantages of using cyanate ester materials is provided in Table 1. One deficiency of cyanate ester chemistry is its low thermal-hydrolytic stability, which mainly manifests itself as reversion of the triazine bond upon high temperature water exposure. So, even though the triazine network is considered to be hydrophobic, especially if compared to the high moisture absorption (i.e., 1.5 to 4%) common in epoxy resins, the degradation that occurs at high temperature in the presence of trace amounts of water becomes a major issue.

Table 1. Advantages & Disadvantages of Cyanate Ester Materials.

| ADVANTAGES | DISADVANTAGES |
|---|---|
| Easy to process | High cost |
| Versatile reactivity | Thermo-hydrolytic stability |
| High service temperature | Dielectric loss can improve |
| Tough - Flexible | Fire resistance |
| Low dielectric loss | Adhesion issues |
| Low moisture absorption | |
| Low Coefficient of Thermal Expansion (CTE) | |

SUMMARY

The present disclosure provides a resin formulation for use in forming a composite layer having a high transition temperature that maintains or incorporates many of the advantages associated with using cyanate ester chemistry and reduces the number and/or magnitude of potential disadvantages. The resin formulation generally comprises a silsesquioxane resin component having an equivalent weight of aromatic hydroxyl groups that is greater than 500 and less than 1,100 grams per mole and a cyanate ester component. Alternatively, the resin formulation may also comprise a cure accelerator. The silsesquioxane resin component is present in an amount that is greater than 10 wt. % of the total solids content of the resin formulation. The silsesquioxane resin component includes less than 10 mol. % of alkoxy and silanol functionality and has a molecular weight ranging between 1,000 and 20,000 grams/mole; alternatively, between 2,000 and 15,000 grams/mole; alternatively, between 3,000 and 10,000 grams per mole; and alternatively between 4,000 and 6,000 grams/mole. Alternatively, the resin formulation may further comprise a solvent.

The silsesquioxane resin component in the resin formulation generally comprises a first portion defined by structural units of $RSiO_{3/2}$ and a second portion defined by structural units of $R_2XSiO_{1/2}$. In these structural units, each R group is independently selected as a methyl group or an aryl group, and X is a moiety that includes an aromatic hydroxyl group. When the R group is selected to be an aryl group, the aryl group may be generally comprised of any moiety that contains one or more aromatic groups. The X moiety may be generally comprised of any aromatic moiety that includes at least one hydroxyl group.

Alternatively, the silsesquioxane resin component may further comprise a third portion defined by structural units of $R_2SiO_{2/2}$, $(R)XSiO_{2/2}$, $R_3SiO_{1/2}$; $XSiO_{3/2}$; or mixtures thereof. The silsesquioxane may optionally include yet a fourth portion defined by structural units of $SiO_{4/2}$.

According to yet another aspect of the present disclosure, a resin composite layer having a high transition temperature is provided. This resin composite layer is generally made from a curable resin formulation that comprises a cyanate ester component; a cure accelerator; and a silsesquioxane resin component having an equivalent weight of aromatic hydroxyl groups that is greater than 500 and less than 1,100 grams per mole and less than 10 mol. % of alkoxy and silanol functionality. The silsesquioxane resin component is present in an amount that is greater than 10 wt. % of the total solids content of the resin formulation. The resin composite layer formed therefrom exhibits a glass transition temperature that is greater than or equal to 185° C. and decreases by less than or equal to 40% upon exposure to water at an elevated temperature for a predetermined amount of time. The resin composite layer is transparent and exhibits a dielectric loss factor (tan δ) that is less than or equal to 0.0075 when measured at either 1 MHz or 10 MHz.

The silsesquioxane resin component in the resin composite layer is comprised of $D^{RR}$, $T^R$, $D^{RX}$, $M^{RRX}$, and Q structural units according to the formula:

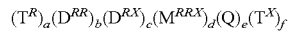

wherein $(T^R)_a$ represents structural units of $(R)SiO_{3/2}$; $(D^{RR})_b$ represents structural units of $(R)_2SiO_{2/2}$; $(D^{RX})_c$ represents structural units of $(R)(X)SiO_{2/2}$; $(M^{RRX})_d$ represents structural units of $(R_2)(X)SiO_{1/2}$; $(Q)_e$ represents structural units of $SiO_{4/2}$; and $(T^X)_f$ represents structural units of $(X)SiO_{3/2}$. Each R group is independently selected to be a methyl group or an aryl group; X is a moiety that includes at least one aromatic hydroxyl group; and the subscripts a-f represent the mole percent of each structural unit according to the relationship (a+b+c+d+e+f)=1 with subscripts a, and d being greater than zero.

According to yet another aspect of the present disclosure, an electronic encapsulation system is provided that includes a composite resin layer comprised of a cured resin formulation as described above and further defined herein.

Further areas of applicability will become apparent from the description provided herein. It should be understood that the description and specific examples are intended for purposes of illustration only and are not intended to limit the scope of the present disclosure.

DETAILED DESCRIPTION

The following description is merely exemplary in nature and is in no way intended to limit the present disclosure or its application or uses. It should be understood that throughout the description and drawings, corresponding reference numerals indicate like or corresponding parts and features.

The present disclosure generally provides a resin formulation based on the modification of cyanate esters with silsesquioxane resins for use in forming a composite structure or layer. More specifically, the resin formulation generally comprises a silsesquioxane resin component having an equivalent weight of aromatic hydroxyl groups that is greater than 500 and less than 1100 grams per mole of aromatic hydroxyl groups and a cyanate ester component. Alternatively, the resin formulation may also comprise a catalyst. In this resin formulation, the silsesquioxane resin component is present in an amount greater than 10 wt. % of the total solids content of the resin formulation.

According to one aspect of the present disclosure, the resin formulation, which includes an organo-reactive silsesquioxane component having a low silanol content formulated with a cyanate ester component at levels higher than 10 wt. %, forms composite structures or layers that exhibit enhanced dielectric characteristics, reduced moisture uptake, and improved thermal-hydrolytic stability in comparison to similar structures or layers comprised of conventional cyanate ester materials. Surprisingly, the modification of a cyanate ester resin via the incorporation of a silsesquioxane resin component according to the teachings of the present disclosure does not result in any substantial decrease or drop in the glass transition temperature ($T_g$) exhibited by the composite formed therefrom when compared to the $T_g$ exhibited by a similar composite formed from unmodified cyanate ester resins.

The resin formulation of the present invention with its use of silsesquioxane resins to modify cyanate ester resins offers several other advantages over conventional resin formulations that use other modifiers (e.g., polyphenyleneoxide) in conjunction with a cyanate ester resin. For example, the processing conditions associated with the cyanate ester/silsesquioxane resin compositions of the present disclosure remain relatively unchanged and similar to the conditions typically utilized when processing conventional unmodified cyanate ester resin compositions. This is in stark contrast to the substantial solution viscosity increase that is observed upon the use of other modifiers, such as polyphenyleneoxide. A large increase in solution viscosity will interfere with effective and cost efficient composite production of composite resin layers formed therefrom.

In general, the silsesquioxane resins of the present disclosure exhibit several properties or attributes that are complimentary to the properties or attributes exhibited by the unmodified cyanate ester resins (see Table 1). A summary of the advantages associated with the use of silsesquioxane resins according to the teachings of the present disclosure is provided in Table 2. The composite structures or layers formed therefrom offer the combined benefits of reduced dielectric loss, improved moisture resistance, and enhanced thermo-hydrolytic stability, when compared to similar composite structures or layers formed using the unmodified cyanate ester resins. These combined benefits are offered by the cyanate ester/silsesquioxane resin formulation without compromising the high $T_g$ associated with unmodified cyanate ester composites.

Table 2. Advantages Associated with Using Silsesquioxane Resins.

Advantages

Thermo-hydrolytic stability
Very low dielectric loss
Low moisture absorption
Fire resistance
Low cost According to one aspect of the present disclosure, the silsesquioxane resin component comprises a first portion defined by structural units of $RSiO_{3/2}$ and a second portion defined by structural units of $R_2XSiO_{1/2}$. Each R group is independently selected as a methyl or an aryl group, while the X functionality represents a moiety that includes at least one aromatic hydroxyl group. When the R group is selected to be an aryl group, the aryl group may be generally comprised of any moiety that contains one or more aromatic groups.

Alternatively, the silsesquioxane resin component further comprises a third portion defined by structural units of $R_2SiO_{2/2}$; $(R)XSiO_{2/2}$; $R_3SiO_{1/2}$; $XSiO_{3/2}$; or mixtures thereof. Each R group in the third component is also independently selected as a methyl group or an aryl group, and the X functionality represents a moiety that includes at least one aromatic hydroxyl group. Alternatively, the silsesquioxane resin may also comprise a fourth portion that can be defined by structural units of $SiO_{4/2}$.

One example, among many, for a silsesquioxane resin component including first, second, and third portions in the resin formulation is shown below in formula (F-1).

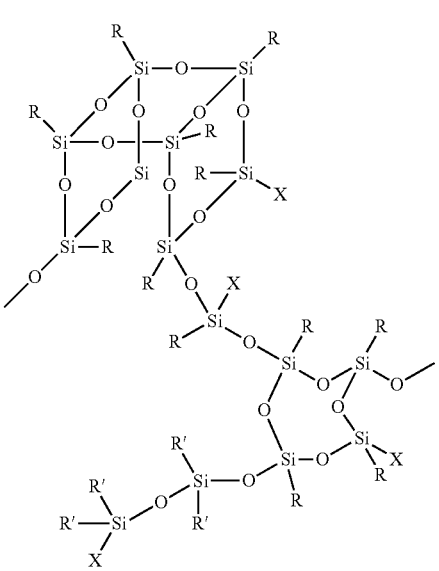

When the R group is selected to be an aryl group, the aryl group may be generally comprised of any moiety that contains one or more aromatic groups. Alternatively, the aryl group is a phenyl group, a tolyl group, a xylyl group, or a naphthyl group. The X moiety may be generally comprised of any aromatic moiety that includes at least one hydroxyl group. Several examples of aromatic hydroxyl groups include, but are not limited to, phenol, chlorophenol, bromophenol, dimethylphenol, o-cresol, m-cresol, p-cresol, hydroquinone, catechol, resorcinol, guaiacol, pyrogallol, phloroglucinol, isopropylphenol, ethylphenol, propylphenol, t-butyl-phenol, isobutylphenol, octylphenol, nonylphenol, cumylphenol, p-phenylphenol, o-phenylphenol, m-phenylphenol, Bisphenol A, dihydroxydiphenyl sulfone, mixtures thereof and the like. The X moiety may be linked to silicon in the silsesquioxane resin component through the use of any bridging group, linking group, or silane coupling agent known to one skilled in the art with the length of the chain in the bridging group being preselected based upon the selection of the X moiety and the desired application.

Alternatively, the X moiety in the silsesquioxane resin component may be comprised of either the phenolic unit described by formula (F-2) or the phenolic unit described by formula (F-3).

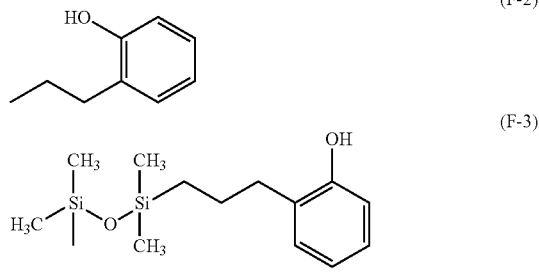

The structural units $(R)(X)SiO_{2/2}$ and the structural units $(R_2)(X)SiO_{1/2}$ that are present in the silsesquioxane resin component may be formed by reacting hydride (Si—H) functionality initially present in the resin as $(R)(H)SiO_{2/2}$ or $(R_2)(H)SiO_{1/2}$ with 2-allylphenol via a hydrosilylation reaction to form the phenolic containing X group shown in formula F-2. Alternatively, the structural units $(R)(X)SiO_{2/2}$ and the structural units $(R_2)(X)SiO_{1/2}$ that may be present in the silsesquioxane resin component can be formed by reacting any vinyl (Si-vinyl) functionality initially present in the resin as (R) (Vinyl)$SiO_{2/2}$ and $(R_2)(Vinyl)SiO_{1/2}$ with an Si—H functional phenol to form the phenolic containing X group shown in formula F-3.

The silsesquioxane resin component has an equivalent weight of aromatic hydroxyl groups that is greater than 500 and less than 2,000 grams per mole of aromatic hydroxyl groups (g/eq. OH); alternatively from 500 to 1,500 gms/eq. OH; alternatively from 500 to less than 1,100 gms/eq. OH. Silsesquioxane resin components having an equivalent weight of phenolic hydroxyl groups that is less than 500 g/eq. OH results in the formation of resin composites exhibiting a low thermal glass transition temperature. Silsesquioxane resin components having an excess of phenolic hydroxyl groups (e.g., ≥1,100 g/eq. OH) may result in the instability of the composite layer formed upon using the silsesquioxane resin component to modify a cyanate ester component.

The silsesquioxane resin component used in the resin formulation exhibits a molecular weight ranging between 1,000 and 20,000 grams/mole; alternatively, between 2,000 and 15,000 grams/mole; alternatively, between 3,000 and 10,000 grams per mole; and alternatively between 4,000 and 6,000 grams/mole with less than 10 mol. % of alkoxy or silanol functionality; alternatively less than 7 mol. % alkoxy or silanol functionality; alternatively less than 2 mol. % alkoxy or silanol functionality. The residual alkoxy functionality, such as methoxy or ethoxy groups, present in the silsesquioxane resin component may be derived from alkoxy silane precursors used to form the silsesquioxane resin, while the residual silanol (Si—OH) functionality may be formed upon the hydrolysis of the silane precursors containing either alkoxy or halogen functionality. A silsesquioxane resin component that contains greater than 10 mol. % alkoxy or silanol functionality results in inadequate or inferior thermal stability.

The cyanate ester component in the resin formulation may comprise any polymer or resin that contains a plurality of cyanate ester (—OCN) functional groups. Such resins may be derived from cyanate ester monomers and prepolymers prepared according to any process known to one skilled in the art. Several examples of cyanate esters resins include 2,2-bis(4-cyanatophenyl)propane, bis(4-cyanatophenyl)ethane, and bis (3,5-dimethyl-4-cyanatophenyl)methane, among others. Alternatively, the cyanate ester component may be a homopolymer or a copolymer that incorporates polymeric segments that do not contain any cyanate ester functionality. Alternatively, the cyanate ester component is a homopolymer of cyanate ester monomers, prepolymers, or partially polymerized cyanate esters that contain a least one bisphenol moiety (i.e., bisphenol A, bisphenol F, etc.). One specific example of a cyanate ester component is the AroCyl® L-10 dicyanate ester monomer available from Huntsman Corporation.

The cure accelerator or catalyst that may be present in the resin formulation, when desirable, may include any metal acetylacetonate or octoate compound. Such acetylacetonate and octoate compounds may include, but not be limited to, iron, cobalt, copper, zinc, chromium, or manganese metals. Alternatively, the cure accelerator is cobalt acetylacetonate.

According to another aspect of the present disclosure, the resin formulation may further comprise a solvent. This solvent may be any organic or siloxane solvent that has sufficiently volatility to evaporate either before or during the cure of the resin formulation to form a resin composite layer. The silsesquioxane and cyanate ester components may be either dissolved in or dispersed within the solvent. Several representative siloxane solvents include linear polysiloxanes, such as hexamethyldisiloxane or octamethyltrisiloxane; and cyclic polysiloxanes, such as hexamethylcyclotrisiloxane or decamethylcyclopentasiloxane. Suitable organic solvents include, but are not limited to, aromatic hydrocarbons, such as benzene, toluene, and xylene; ketones, such as methylethyl ketone or methyl isobutyl ketone; aliphatic hydrocarbons, such as heptane, hexane, or octane; glycol ethers, such as propylene glycol methyl ether; acetates, such as ethyl acetate or butyl acetate; and halogenated hydrocarbons, such as dichloromethane. Alternatively, the solvent is toluene or xylene.

According to another aspect of the present disclosure a resin composite layer that exhibits a high transition temperature is provided. The resin composite layer comprises a curable resin formulation. The resin composite layer is cured at an elevated temperature for a predetermined amount of time. The curable resin formulation that forms the composite layer comprises a cyanate ester component; a cure accelerator; and a silsesquioxane resin component having an equivalent weight of aromatic hydroxyl groups that is greater than 500 and less than 1,100 grams per mole and less than 10 mol. % of alkoxy and silanol functionality. This silsesquioxane resin component is present in the curable resin formulation in an amount that is greater than 10 wt. % of the total solids content of the resin formulation. The resin composite layer exhibits a glass transition temperature that is greater than or equal to 185° C.; alternatively greater than or equal to 200° C.

The resin composite layer exhibits exceptional hydrolytic stability at elevated temperatures. The glass transition temperature exhibited by the resin composite layer decreases by less than or equal to 40% upon exposure to water at an elevated temperature for a predetermined amount of time; alternatively less than a decrease of about 35%. The conditions to which the resin composite layer is typically exposed in order to determine hydrolytic stability of said layer is 180° C. for 2 hours with 100% water in a high pressure enclosure.

The resin composite layer is transparent in both the uncured state, as well as in the cured state. In the cured state, the resin composite layer exhibits a dielectric loss factor (tan δ) that is less than or equal to 0.0075 when measured at either 1 MHz or 10 MHz.

The silsesquioxane resin component in the resin composite layer is generally comprised of $D^R$, $T^R$, $T^x$, $D^{RX}$, $M^{RRX}$, and Q structural units according to the formula:

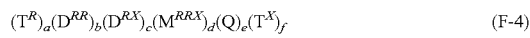

$$(T^R)_a(D^{RR})_b(D^{RX})_c(M^{RRX})_d(Q)_e(T^X)_f \quad \text{(F-4)}$$

The $(T^R)_a$ in this formula (F-4) represents structural units of $(R)SiO_{3/2}$; $(D^{RR})_b$ represents structural units of $(R)_2SiO_{2/2}$; $(D^{RX})_c$ represents structural units of $(R)(X)SiO_{2/2}$; $(M^{RRX})_d$ represents structural units of $(R_2)(X)SiO_{1/2}$; $(Q)_e$ represents structural units of $SiO_{4/2}$; and $(T^X)_f$ represents structural units of $(X)SiO_{3/2}$. Each R group is independently selected to be a methyl group or an aryl group, and X is a moiety that includes at least one aromatic hydroxyl group. The subscripts a-f represent the mole % of each structural unit according to the relationship (a+b+c+d+e+f)=1 with subscripts a and d being greater than zero. The silsesquioxane resin component in the resin composite layer has a molecular weight ranging between 1,000 and 20,000 grams/mole; alternatively, between 2,000 and 15,000 grams/mole; alternatively, between 3,000 and 10,000 grams per mole; and alternatively between 4,000 and 6,000 grams/mole.

The composite resin layer can be formed using any process known to one skilled in the art. Such processes may include coating, casting, and molding among others. Once the composite resin layer is formed, said layer is cured by heating the layer at an elevated temperature for a predetermined amount of time. The cure temperature may be any temperature greater than about 175° C., alternatively greater than about 200° C.; alternatively greater than about 250° C. The length of time may be about 30 minutes or more; alternatively 1 hour or more; alternatively about 3 hours.

According to another aspect of the present disclosure, an electronic encapsulation system is provided that includes a resin composite layer comprised of the cured resin formulation described herein. The electronic encapsulation system may be used in or with an electronic device. The electronic device may include, but not be limited to, multi-layer printed circuit boards and power semiconductor modules. This cured resin formulation includes a cyanate ester component and a silsesquioxane resin component. Alternatively, the cured resin formulation may further comprise a cure accelerator. The silsesquioxane component has an equivalent weight of aromatic hydroxyl groups that is greater than 500 and less than 2,000 grams per mole of aromatic hydroxyl groups (g/eq. OH); alternatively from 500 to 1,500 gms/eq. OH; alternatively from 500 to less than 1,100 g/eq. OH. The silsesquioxane resin component also has less than 10 mol. % of alkoxy and silanol functionality and is present in an amount that is greater than 10 wt. % of the total solids content of the resin formulation. The resin composite layer exhibits a glass transition temperature that is greater than 185° C.

The resin composite layer when incorporated into an electronic device as a resin composite layer may act as a barrier layer that provides environmental or hermetic protection to the electronic device. The resin composite layer is compatible with the materials used in the construction of the electronic device. For example, the resin composite layer when used in a multilayer printed circuit board (PCB) is compatible with the copper metalization, polymer material, and glass fibers used in the construction of the printed circuit board. In this specific case, the polymer material may be a phenolic, epoxy, polytetraethylene, polyimide, or polystyrene resin.

A wafer level embedded package represents one example in which the resin composite layer may be used in an electronic device. Such a package is formed using compression molding in which the resin composite is spread evenly onto silicon dies that are placed on a molding tape mounted on a first dicing ring. The resin composite layer is covered with a mold release tape mounted on a second dicing ring. The dicing rings along with the dies and composite resin are then placed into a compression molding tool. A clamping force is applied along with heat for a certain duration of time to melt and cure composite resin. Finally, clamps are opened and the mold release tapes are removed, thereby, resulting in a molded wafer. A further description of embedded wafer level technology is described in an article by Kumar et al, published at the 2009 Electronic Components and Technology Conference (IEEE), p 1289-1296, the entire content of which is hereby incorporated by reference.

The following specific examples are given to illustrate the disclosure and should not be construed to limit the scope of the disclosure. Those skilled-in-the-art, in light of the present disclosure, will appreciate that many changes can be made in the specific embodiments which are disclosed herein and still obtain alike or similar result without departing from or exceeding the spirit or scope of the disclosure. The following examples confirm the benefits associated with the resin formulation of the present disclosure and highlight the acceptable ranges associated with the resin formulations, as well as the resin composite layers formed therefrom.

EXAMPLE 1

Silsesquioxane Resin Component Properties

Several different silsesquioxane resin components were prepared according to the teachings of the present disclosure (described as Resins 2, 4, 5, 6, & 7 in Run No.'s 1-8 of Table 3) along with several conventional silsesquioxane resin components (described as Resins 1, 3, 8, & 9 in Comparative No.'s B-E of Table 3). The molecular weight, total alkoxy & silanol content, and the equivalent weight of phenolic hydroxyl groups measured for each of the silsesquioxane resin components are summarized in Table 3.

TABLE 3

Measured Properties for Silsesquioxane Resin Components.

| Run No. | Resin # | Equivalent Weight Phenolic Groups (g/eq OH) | Total Alkoxy & Silanol Groups (mol %) | Molecular Weight (g/mol) | % |
|---------|---------|---------------------------------------------|--------------------------------------|--------------------------|-----|
| Comp. A | N/A     | N/A   | N/A | N/A   | N/A |
| Comp. B | Resin 1 | 457   | 5   | —     | 70  |
| Comp. C | Resin 3 | 1100  | 12  | 4360  | 70  |
| Comp. D | Resin 8 | 1680  | 1   | 3630  | 67  |
| Comp. E | Resin 9 | 1480  | 1   | 39500 | 62  |
| Run 1   | Resin 4 | 1045  | 2   | 4580  | 70  |
| Run 2   | Resin 4 | 1045  | 2   | 4580  | 70  |
| Run 3   | Resin 5 | 902   | 0   | 4200  | 69  |
| Run 4   | Resin 5 | 902   | 0   | 4200  | 69  |
| Run 5   | Resin 5 | 902   | 0   | 4200  | 69  |
| Run 6   | Resin 6 | 655   | 2   | 5950  | 70  |
| Run 7   | Resin 7 | 884   | 2   | 4640  | 70  |
| Run 8   | Resin 2 | 562   | 7   | 4200  | 70  |

Referring to Table 3, each of the silsesquioxane resins prepared according to the teachings of the present disclosure (Resins 2 and 4-7) exhibit an equivalent weight of aromatic hydroxyl groups that is greater than 500 and less than 1,100 g/eq. OH. In addition these silsesquioxane resin components (Resins 2 and 4-7) further exhibit a total alkoxy and silanol content on the order of less than 10 mole percent and a molecular weight ranging between 4,000 and 6,000 grams/mole. In comparison, the conventional silsesquioxane resin components (Resins 1, 3, 8, & 9) each exhibit an equivalent weight of aromatic hydroxyl groups that is either less than 500 g/eq. OH (Resin 1) or greater than or equal to 1,100 g/eq. OH (Resins 3, 8, & 9). In addition, Resin 3 exhibits a total alkoxy and silanol content that is greater than 10 mole %, while Resin 9 has a molecular weight substantially in excess of 30,000 g/mol. One skilled in the art will understand that various methods may be used to measure the foregoing properties. For example, the molecular weight of the silsesquioxane resin components can be measured using gel permeation chromatography.

EXAMPLE 2

Composition of Resin Formulations

Each of the silsesquioxane resin components (Resins 1-9) described above in Example 1 was used to form a resin formulation containing a cyanate ester component, an optional cure accelerator (e.g, catalyst), and optionally a solvent according to the weight proportions shown below in Table 4. Each of the components in the resin formulations were mixed in glass vials on a rotating wheel for 1 to 2 hours to form the resin formulations in Run No.'s 1-8 and Comparative No.'s A-E. The cyanate ester used to prepare these resin formulations was a dicyanate ester monomer (AroCyl® L-10, Huntsman Corporation), the cure accelerator was cobalt acetylacetonate, and the solvent was xylene.

TABLE 4

Composition of Resin Formulations.

| Run No. | Resin No. | Cyanate Ester (gms) | Silsesquioxane Resin (gms) | Solvent (gms) | Cure Accelerator (gms) | wt. % Si |
|---|---|---|---|---|---|---|
| Comp. A | N/A | 8 | 0 | 1.54 | 0.46 | 0% |
| Comp. B | Resin 1 | 2.1 | 1.29 | 0 | 0.17 | 30% |
| Comp. C | Resin 3 | 2.1 | 1.28 | 0 | 0.17 | 30% |
| Comp. D | Resin 8 | 5.6 | 3.61 | 0.03 | 0.46 | 30% |
| Comp. E | Resin 9 | 5.6 | 3.85 | 0 | 0.46 | 30% |
| Run 1 | Resin 4 | 6.4 | 2.3 | 0.63 | 0.46 | 20% |
| Run 2 | Resin 4 | 5.6 | 3.45 | 0.65 | 0 | 30% |
| Run 3 | Resin 5 | 2.4 | 0.87 | 0.11 | 0.17 | 20% |
| Run 4 | Resin 5 | 2.1 | 1.3 | 0 | 0.17 | 30% |
| Run 5 | Resin 5 | 1.8 | 1.73 | 0 | 0.17 | 40% |
| Run 6 | Resin 6 | 5.6 | 3.45 | 0.18 | 0.46 | 30% |
| Run 7 | Resin 7 | 5.6 | 3.41 | 0.22 | 0.46 | 30% |
| Run 8 | Resin 2 | 2.1 | 1.29 | 0 | 0.17 | 30% |

Referring now to Table 3, the resin formulation described as Comp. No. A was prepared without using a silsesquioxane resin component and represents a conventional cyanate ester formulation. Each of the other resin formulations was prepared to comprise greater than about 10 wt. % silicon. More specifically, the comparative resin formulations (Comp. No.'s B-E) and the resin formulations in Run No.'s 2, 4, & 6-8 were prepared such that they comprise 30 wt. % silicon, while Run No.'s 1 and 3 were prepared to comprise 20 wt. % silicon and Run No. 5 was prepared to comprise 40 wt. % silicon. The weight percentage of silicon present in the resin formulation is calculated on a solids basis and indicates the level of Si modification of the cyanate ester resin used in the resin formulation. No solvent was present in the resin formulations described as Comparative No.'s B, C, and E, as well as Run No.'s 4, 5, and 8.

EXAMPLE 3

Resin Composite Layer Properties

Each of the comparative resin formulations (Comp. No.'s A-E) and resin formulations prepared according to the teachings of the present disclosure (Run No.'s 1-8) were cast to form 1-2 mm thick resin composites layers or sheets. Each of the cast resin composite layers was then cured by slowly increasing the temperature from 25° C. to 200° C. over a period of 30 minutes, followed by continuous exposure to 200° C. for 3 hours. The various properties measured by the conventional resin composite layers (Comp. No.'s A-E) are compared against the resin composite layers of the present disclosure (Run No.'s 1-8) in Table 5.

TABLE 5

Measured Properties of Resin Composite Layers.

| Run No. | Resin # | Appearance Solution | Appearance Cured | $T_g$-Cured (° C.) | $T_g$-2 hrs @ 180° C. w/H2O (° C.) | $\Delta T_g$ (° C.) | $\Delta T_g$ (%) | TGA, iso @ 288° C. (wt. %) | Water uptake (wt. %) |
|---|---|---|---|---|---|---|---|---|---|
| Comp. A | N/A | Clear | Clear | 215 | 99 | 127 | 59 | 3 | 1.16% |
| Comp. B | Resin 1 | Clear | Clear | 177 | 148 | 29 | 16 | 8 | — |
| Comp. C | Resin 3 | Clear | Sl. Cldy | 208 | 115 | 93 | 45 | 9 | — |
| Comp. D | Resin 8 | Cloudy | Cloudy | 220 | 108 | 112 | 51 | 4 | 1.01% |
| Comp. E | Resin 9 | Sl. Cld. | Cloudy | 224 | 114 | 110 | 49 | 3 | 1.03% |
| Run 1 | Resin 4 | Clear | Clear | 215 | 146 | 69 | 32 | 5 | 0.88% |
| Run 2 | Resin 4 | Clear | Clear | 205 | 138 | 67 | 33 | 8 | 0.84% |
| Run 3 | Resin 5 | Clear | Clear | 213 | 150 | 63 | 30 | 6 | 1.07% |
| Run 4 | Resin 5 | Clear | Clear | 211 | 145 | 66 | 31 | 7 | 0.99% |
| Run 5 | Resin 5 | Clear | Clear | 190 | 149 | 41 | 22 | 7 | 0.75% |
| Run 6 | Resin 6 | Clear | Clear | 185 | 121 | 64 | 35 | 6 | 0.90% |
| Run 7 | Resin 7 | Clear | Clear | 210 | 125 | 85 | 40 | 6 | 0.89% |
| Run 8 | Resin 2 | Clear | Clear | 188 | 148 | 40 | 21 | 9 | — |

One skilled in the art will understand that the properties measured for the resin composite layers as described in Table 5 represent properties that are routinely measured and can be obtained by multiple different methods. The methods described herein represent one such method and other methods may be utilized without exceeding the scope of the present disclosure. The glass transition temperature is measured using differential scanning calorimetry with hydrolytic stability being tested after exposure of the resin composites to 100% water in a high pressure enclosure at 180° C. for 2 hours followed by drying for two hours at 105° C. Weight loss can be evaluated using thermal gravimetric analysis (TGA) upon exposure of the composite resin layers to a temperature of 288° C.: for 1 hour. Water uptake by the resin composite layers was determined by drying the composite layers for 2 hours at 105° C., followed by immersion in water at 90° C. for 10 days; the wet samples were weighed and water uptake calculated according to the relationship of (wet sample wt.–dry sample wt.)/(dry sample wt.).

Referring now to Table 5, the appearance of the resin formulations prepared according to the teachings of the present disclosure (Run No.'s 1-8) prior to the formation of a resin composite layer, as well as after formation and curing of the resin composite layer are substantially transparent or clear. In comparison, several of the comparative resin formulations are cloudy or have a reduced level of transparency prior to formation of a resin composite layer (Comp. No.'s D & E) or after formation and curing of the composite resin layer (Comp. No.'s C-E).

The glass transition temperature, $T_g$, exhibited by a conventional cyanate ester composite layer (Comp. No. A) is on the order of 215° C. with a decrease of 99° C. or 59% encountered upon exposure to water at an elevated temperature for a predetermined amount of time (e.g., 2 hours at 180° C.). Each of the resin composite layers formed according the teachings of the present disclosure (Run No.'s 1-8) maintains a high glass transition temperature and enhances the thermal hydrolytic stability of the composite. In other words, the glass transition temperature, $T_g$, exhibited by resin composite layers prepared using the resin formulations of the present disclosure (Run No.'s 1-8) are greater than or equal to 185° C. with a decrease of less than or equal to 85° C. or 40% upon exposure to water at an elevated temperature.

In comparison, one composite layer formed from a comparative resin formulation (Comp. No. B) exhibits a low glass transition temperature of 177° C. The low $T_g$ exhibited by this composite layer (Comp. No. B) is believed to correlate with the low equivalent weight of phenolic hydroxide groups present in the resin formulation (see Table 3) used to prepare this composite layer. The other composite layers formed from comparative resin formulations (Comp. No.'s C-E) all exhibit large decreases in their glass transition temperature upon exposure to water at an elevated temperature, i.e., on the order of greater than 90° C. or 45%. The poor hydrolytic stability of these comparative composite layers (Comp. No.'s C-E) is believed to be due to the high amount of residual alkoxy and silanol groups (see Table 3) present in the silsesquioxane resin component used to form the resin formulations from which the composite layers were formed.

The resin composite layers formed using resin formulations of the present disclosure (Run No.'s 1-8) exhibit similar high temperature stability in the absence of water as the comparative resin composite layers (Comp. No.'s B-E) and the conventional cyanate ester composite layer (Comp. No. A). More specifically, the composite resin layers in Run No.'s 1-6 and in Comp. No.'s A-E exhibited a weight loss upon exposure to a temperature of 288° C. between 3 and 9 wt. %. In addition, the resin composite layers (Run No.'s 1-8) of the present disclosure exhibit a level of moisture pick-up or uptake that is lower than the water pick-up observed for conventional cyanate ester composite layers (Comp. No. A).

Several composite layers prepared using resin formulations of the present disclosure (Run No.'s 3-5) were further compared against the conventional cyanate ester composite layer (Comp. No. A) with respect to coefficient of thermal expansion (CTE) and dielectric properties as shown in Table 6. In each case, the composite resin layers of the present disclosure performed as well, if not better than, the conventional cyanate ester composite layer. More specifically, the composite resin layers (Run No.'s 3-5) exhibited a CTE that was on the order of 10-20% higher than the cyanate ester composite layer (Comp. No. A), as well as a dielectric constant and loss factor that was about 10% and between 30-40% lower, respectively. The dielectric loss factor for Run No's 1-8 is less than 0.0075 at both 1 MHz and 10 MHz.

Thus the composite resin layers formed using resin formulations prepared according to the teachings of the present disclosure provide the same advantages provided by cyanate ester chemistry for use in high-end microelectronics packaging, multi-layer circuit boards and aerospace composite applications. In addition, the composite structures or layers formed from the resin formulations of the present disclosure offer the combined benefits of reduced dielectric loss, improved moisture resistance, and enhanced thermo-hydrolytic stability, when compared to similar composite structures or layers formed using the unmodified cyanate ester resins.

TABLE 6

Coefficient of Thermal Expansion and Dielectric Constant.

| Run No. | Resin # | CTE, α1 (ppm/° C.) | CTE, α2 (ppm/° C.) | Dielectric Constant ε, (1 MHz) | Dielectric Constant ε, (10 MHz) | tan δ (1 MHz) | tan δ (10 MHz) |
|---|---|---|---|---|---|---|---|
| Comp. A | N/A | 58.6 | 131.5 | 3.05 | 3.01 | 0.0087 | 0.0107 |
| Run 3 | Resin 5 | 68 | 144 | 2.88 | 2.85 | 0.0059 | 0.0068 |
| Run 4 | Resin 5 | 74.5 | 156 | 2.81 | 2.8 | 0.0051 | 0.0066 |
| Run 5 | Resin 5 | 81 | 168 | 2.83 | 2.82 | 0.0044 | 0.0056 |

α1: coefficient of thermal expansion as measured by thermo-mechanical analysis from 50° C. to Tg − 5° C.
α2: coefficient of thermal expansion from Tg + 5° C. to 260° C.
Dielectric constant and loss (tan δ) measurements done on 2 mm thick samples using air gap methodology

EXAMPLE 4

Preparation of Silsesquioxane Resin Components

Resin 1—A 3 liter, 3-neck round bottom flask was loaded with phenyltrimethoxysilane (785.18 g) and methyltrimethoxysilane (539.44 g). The flask was equipped with a Teflon® stir paddle, thermometer, and a Dean Stark apparatus attached to a water-cooled condenser. A total of 0.662 g, 390 uL of trifluoromethanesulfonic acid (FC-24, 3M Company) was added; followed by the slow addition of deionized water (186.28 g, 10.34 moles) at room temperature. The temperature was increased to 71° C. in order to distill off methanol (572.9 g). The reaction mixture was then cooled to 50° C. and 248.30 g of tetramethyldisiloxane was added followed by glacial acetic acid (111.1 g). The reaction mixture was heated at 50° C. for 3 hours. Then the volatiles (177.5 g) were distilled off by increasing the pot temperature to 70° C. Then n-heptane (439.7 g) was added to the reaction mixture. The reaction mixture was washed with deionized water (1×150 mL for 15 min at 40° C.; 1×100 mL for 15 min at 40° C.; 3×75 mL for 15 min at 40° C.–final wash water pH=3.0). The reaction mixture was heated to reflux and the water removed via azeotropic distillation.

The resin was stripped to dryness using a rotary evaporator at an oil bath temperature of 120° C. and a pressure of ~1 mm Hg. The resin was dissolved into toluene at 80% solids. A 250 mL 3-neck round bottom flask was loaded with 2-allylphenol (27.77 g) and heated to 105° C. Then 0.113 g of a platinum catalyst dissolved in toluene (6400 ppm Pt) was added. A total of 68.75 g of the above Si—H resin solution was slowly added to the round bottom flask. The reaction mixture was then heated to 110° C. for 30 minutes. The resulting resin was stripped to dryness using the rotary evaporator at an oil bath temperature of 150° C. and a pressure of ~1 mm Hg. The silsesquioxane resin was dissolved in xylenes (32.94 g) to produce a 70 wt. % solids solution, which was pressure filtered through a 1.2 µm filter and stored until used to form a resin formulation.

Resin 2—A 2 liter 3-neck round bottom flask was loaded with 736.66 g of Dow Corning® 217 Flake Resin and 491.09 g of toluene. The flask was equipped with a thermometer, air driven Teflon® stir paddle, and a Dean Stark apparatus attached to a water-cooled condenser. The 217 Flake resin dissolved into the toluene. Then tetramethyldisilazane (153.64 g) was added at room temperature followed by trifluoroacetic acid (0.200 g). The reaction mixture was heated to reflux temperature for 4 hours; then cooled to room temperature. A total of 3.0 g of sodium bicarbonate was added and the reaction mixture mixed for 3 hours at room temperature. The reaction mixture was then pressure filtered through a 0.45 µm filter. The resin was stripped to dryness (rotary evaporator, oil bath 120° C., full vacuum). The collected resin was redissolved into toluene at 70% solids. Then a 3 liter 3-neck round bottom flask was charged with 2-allylphenol (319.0 g) and heated to a temperature of 105° C. Then 3.05 g of a platinum catalyst dissolved in toluene (3708 ppm Pt in toluene) was added. The above Si—H resin (70% in toluene, 832.8 g) was slowly added to the reaction mixture and then heated to 110° C. for 1.5 hrs. FTIR analysis indicated a small amount of Si—H was still present. Thus an additional amount of 2-allyl phenol (10 g) was added and the reaction mixture heated to 110° C. for 1 more hour. FTIR analysis indicated no Si—H remained. Thus the resin was stripped to dryness using a rotary evaporator at an oil bath temperature of 150° C. and a pressure of 0.25-0.50 mm Hg. The collected resin was dissolved into xylenes (462.8 g) at 70 wt. % solids, pressure filtered through a 1.2 µm filter, and then stored until used to form a resin formulation.

Resin 3—A 2 liter 3-neck round bottom flask was loaded with Dow Corning® 217 flake resin (830.0 g) and toluene (553.3 g). The flask was equipped with a thermometer, air driven Teflon® stir paddle, and a water-cooled condenser. The 217 flake resin dissolved in the toluene. Then tetramethyldisilazane (74.87 g) was added followed by trifluoroacetic acid (0.146 g). The reaction mixture was heated at reflux for 4 hours. The resin was stripped to near dryness using a rotary evaporator at an oil bath temperature of 100° C. and a pressure of ~1 mm Hg. The resin was redissolved into toluene (69.6% NVC) and pressure filtered through a 5.0 µm filter. Then in a 2 liter 3-neck round bottom flask 2-allylphenol (175.5 g) was loaded and heated to 105° C. Then 3.06 g of a platinum catalyst dissolved into toluene (3519 ppm Pt) was added. The above Si—H functional resin (1258 g w/ 876 g solids) was slowly to the round bottom flask and heated to 110° C. for 1 hour. The resin was stripped to dryness using a rotary evaporator at an oil bath temperature of 150° C. and a pressure of ~1 mm Hg. The resin was dissolved into methyl isobutyl ketone at 70 wt. % solids, pressure filtered through a 5.0 µm filter, and stored until used to form a resin formulation.

Resin 4—A 2 liter 3-neck round bottom flask was loaded with tetramethyldivinyldisiloxane (63.90 g), DI water (214.7 g), and toluene (517.4 g). Then 0.608 g of trifluoromethanesulfonic acid (FC-24, 3M Company) dissolved in DI water (5.44 g) was added with stirring. Then a mixture of phenyltrimethoxysilane (659.9 g) and tetraethoxysilane (82.74 g) was slowly. The resulting mixture was heated at reflux for 2 hours and then cooled to 50° C. Calcium carbonate (1.38 g) was then added and the mixture stirred overnight at room temperature. The volatiles (758.0 g) were distilled off at a pot temperature of 80° C. Then toluene (758.0 g) in an amount equal to what was removed was added. The volatiles (253.1 g) were distilled off until the vapor temperature reached 85° C. The mixture was then cooled to 50° C. and filtered (1.2 μm filter). Then a total of 1.26 g of potassium hydroxide (45.7 wt % in water) and 1.94 g of DI water was added. The mixture was heated to reflux and the water removed via azeotropic distillation. The some of the solvent (164 g) was distilled off in order to increase the solids content to ~50 wt. %. The mixture was allowed to continue to body at 80° C. for 18 hours. The mixture was then cooled and acetic acid (1.16 g) added. The mixture was stirred for 1 hour and then pressure filtered through a 1.2 μm filter. A 250 mL 3-neck round bottom flask was loaded with the above vinyl resin solution (103.4 g, 50.0 g solids). The flask was equipped with a thermometer, magnetic stir bar, and a water-cooled condenser. A nitrogen blanket was applied. The solution was heated to 105° C. and then 0.360 g of a platinum catalyst dissolved in toluene (1691 ppm Pt) was added. The phenolic silane was then added slowly and the mixture heated to 110° C. for 30 minutes. The resin was stripped to dryness using a rotary evaporator at an oil bath temperature of 100° C. and a pressure of ~2.5 mm Hg. The collected resin was dissolved into xylenes at 70 wt. % solids.

Resin 5—A 1 liter 3-neck round bottom flask was loaded with Dow Corning® 255 flake resin (150.3 g) and xylenes (308.0 g). The flask was equipped with a thermometer, air driven Teflon® stir paddle, and a Dean Stark apparatus attached to a water-cooled condenser. The 255 flake resin dissolved into xylene solvent. The solution was heated to reflux for 30 minutes and then cooled to room temperature. A total of 44.9 g of chlorodimethylvinylsilane was then added. The reaction mixture was heated to 75° C. for 4 hours then at reflux for 1 hour. Some of the volatiles (119.3 g) were distilled off and then some additional xylenes (80.0 g) added. Any HCl was removed by water washing. The following process was repeated several times: 1) Added 30 mL DI water, 2) heated to 80° C. for 15 min and then 3) removed aqueous phase. The mixture was heated to reflux temperature and water removed via azeotropic distillation. Then 10 wt. % KOH aqueous solution (1.81 g) was added. The mixture was heated to reflux for 3 hours using a xylenes prefilled Dean Stark apparatus and then cooled to room temperature. Then a 10 wt. % glacial acetic acid in xylenes solution (1.74 g) was added and the mixture allowed to mix overnight at room temperature. The mixture was then pressure filtered through a 0.45 μm filter and the resin stripped to dryness using a rotary evaporator at an oil bath temperature of 150° C., and a pressure of ~0.5 mm Hg. The resin was dissolved into xylenes at 45.0% solids. A 250 mL 3-neck round bottom flask was loaded with the above vinyl resin solution (83.68 g, 37.66 g solids). The flask was equipped with a thermometer, magnetic stir bar, and a water-cooled condenser. A nitrogen blanket was applied and the flask heated to 105° C. Then 0.372 g of a platinum catalyst dissolved in toluene (1335 ppm Pt) was added. Then the phenolic silane described in Example 5 was slowly added and the mixture heated to 110° C. for 30 minutes. Some of the xylenes were distilled off to increase the solids content.

Resin 6—A 250 mL 3-neck round bottom flask was loaded with vinyl resin (55.74 g) described in Example 6. The flask was equipped with a thermometer, magnetic stir bar, and a water-cooled condenser. A nitrogen blanket was applied. The mixture was heated to 100° C. and then 0.236 g of a platinum catalyst dissolved in toluene (1700 ppm Pt) was added. Then phenolic silane described in Example 5 was slowly added. The mixture was heated to 110° C. for 15 minutes. Then xylene (4.94 g) was added to reduce the product concentration to ~70%.

Resin 7—A 250 mL 3-neck round bottom flask was loaded with vinyl resin (55.73 g) described in Example 6. The flask was equipped with a thermometer, magnetic stir bar, and a water-cooled condenser. A nitrogen blanket was applied. The flask was then heated to 100° C. and 0.209 g of a platinum catalyst dissolved in toluene (1700 ppm Pt) was added. Then phenolic silane described in Experiment 5 was slowly added and the mixture allowed to mix for 15 minutes while cooling.

Resin 8—A 250 mL 3-neck round bottom flask was loaded with vinyl resin (79.49 g) from Example 6. The flask was equipped with a thermometer, magnetic stir bar, and a water-cooled condenser. A nitrogen blanket was applied. The flask was then heated to 100° C. and 0.264 g of a platinum catalyst dissolved in toluene (1700 ppm Pt) added. The phenolic silane of Example 5 was then added slowly. The mixture allowed to mix for 15 minutes while cooling.

Resin 9—A 500 mL 3-neck round bottom flask was loaded with phenyltrimethoxysilane (91.33 g), methyltrimethoxysilane (62.85 g), and tetramethyl-divinyldisiloxane (7.46 g). The flask was equipped with a thermometer, Teflon® stir paddle, and a Dean Stark apparatus attached to a water-cooled condenser. A nitrogen blanket was applied. Then trifluoromethanesulfonic acid (FC-24, 3M Company) was added (48 uL, 0.081 g) followed by a slow addition of DI water (24.86 g) at room temperature. The mixture was heated to 60° C. for 3 hours then methanol (73.4 g) was distilled off at a pot temperature of 80° C. Then xylenes (121.2 g) followed by DI water (24.86 g) and 10 wt. % KOH (aq) solution (1.30 g) were added. The xylenes were added in an amount equal to the volume of the Dean Stark. The mixture was heated to reflux and the aqueous phase (36.1 g) removed from the Dean Stark apparatus. A total of 26.0 g of volatiles was removed. The mixture was then cooled to 100° C. and added more DI water (6.22 g) added. The mixture was heated to reflux and only the aqueous phase (6.7 g) was removed. The mixture was reheated to reflux for 3 hours and then cooled to room temperature. A 10 wt. % glacial acetic acid in xylene solution (1.05 g) was then added and the mixture allowed to mix for 3 hours. The mixture was pressure filtered through a 0.45 μm filter and the resin stripped to near dryness using a rotary evaporator at an oil bath temperature of 120° C. and a pressure of ~2.5 mm Hg. The resin was then dissolved into xylenes (59.5% NVC). A 250 mL 3-neck round bottom flask was loaded with the above vinyl resin solution (84.0 g). The flask was equipped with a thermometer, magnetic stir bar, and a water-cooled condenser. A nitrogen blanket was applied. The flask was heated to 100° C. and then 0.384 g of a platinum catalyst dissolved in toluene (1233 ppm Pt) was added. Then the phenolic silane was slowly added and allowed to mix for 15 minutes while cooling.

EXAMPLE 5

Preparation of Phenolic Silane

A 500 mL 3-neck round bottom flask was loaded with tetramethyldisiloxane (150.0 g). The flask was equipped with a magnetic stir bar, thermometer, and a water-cooled condenser. A nitrogen blanket was applied. The flask was then heated to 55° C. and 0.459 g of a platinum catalyst dissolved in toluene (1225 ppm Pt) was added. Then 2-allylphenol (37.8 g) was added over a time frame of ~20 seconds. The heating was then discontinued. However, the mixing was continued for 5 hours while cooling to room temperature. The vinyl product was collected on a rotary evaporator at room temperature and a pressure of ~0.5 mm Hg.

EXAMPLE 6

Preparation of Vinyl Resin

A 1 liter 3-neck round bottom flask was loaded with phenyltrimethoxysilane (161.54 g), methyltrimethoxysilane (110.88 g), and tetramethyldivinyldisiloxane (53.49 g). The flask was equipped with a thermometer, Teflon® stir paddle, and a Dean Stark apparatus attached to a water-cooled condenser. A nitrogen blanket was applied. A total of 80 μL of trifluoromethanesulfonic acid (FC-24, 3M Company) was added, followed by a slow addition of DI water (44.0 g). The mixture was heated at 60° C. for 3 hours. The methanol (131.2 g) was distilled off at a pot temperature of 80° C. Then xylene (214.1 g) was added followed by DI water (44.0 g) and 10 wt. % KOH (aq) solution (2.64 g). The xylenes were added in an amount equal to the volume of the Dean Stark. The mixture was heated to reflux and the aqueous phase (55.3 g) removed from the Dean Stark apparatus. A total of 45.6 g of volatiles was removed. The mixture was cooled to 100° C. and more DI water (11.0 g) was added. The mixture was heated to reflux and the aqueous phase (11.1 g) removed. Then more volatiles (40.5 g) were removed by heating the mixture to reflux for 3 hours. The mixture was cooled to room temperature and 10 wt. % glacial acetic acid in xylenes solution (2.21 g) was added. The mixture was mixed at room temperature for 3 hours. Then the mixture was pressure filtered through a 0.45 μm filter. The product was stripped to dryness using a rotary evaporator at an oil bath temperature of 100° C. and a pressure of ~2.5 mm Hg. The collected product was dissolved into xylenes at 62.9% solids and stored for future use.

A person skilled in the art will recognize that the measurements described are standard measurements that can be obtained by a variety of different test methods. The test methods described in the examples represents only one available method to obtain each of the required measurements.

The foregoing description of various embodiments of the invention has been presented for purposes of illustration and description. It is not intended to be exhaustive or to limit the invention to the precise embodiments disclosed. Numerous modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A resin formulation for use in forming a composite layer having a high glass transition temperature, the resin formulation comprising:
    a silsesquioxane resin component having an equivalent weight of aromatic hydroxyl groups that is greater than 500 and less than 2,000 grams per mole of aromatic hydroxyl groups (g/eq. OH); and
    a cyanate ester component;
    wherein the silsesquioxane resin component is present in an amount that is greater than 10 wt. % of the total solids content of the resin formulation.

2. The resin formulation of claim 1, wherein the silsesquioxane resin component comprises a first portion defined by structural units of $RSiO_{3/2}$ and a second portion defined by structural units of $R_2XSiO_{1/2}$;
    wherein each R group is independently selected as a methyl group or an aryl group, and X is a moiety that includes the aromatic hydroxyl group.

3. The resin formulation of claim 1, wherein the resin formulation further comprises a cure accelerator.

4. The resin formulation of claim 2, wherein the silsesquioxane resin component further comprises a third portion defined by structural units of $R_2SiO_{2/2}$; $R_3SiO_{1/2}$; $(R)XSiO_{2/2}$; $XSiO_{3/2}$; or mixtures thereof;
    wherein each R group is independently selected as a methyl group or an aryl group, and X is a moiety that includes the aromatic hydroxyl group.

5. The resin formulation of claim 4, wherein the aryl group is phenyl group, a tolyl group, a xylyl group, or a naphthyl group.

6. The resin formulation of claim 4, wherein the X moiety is a phenol, chlorophenol, bromophenol, dimethylphenol, o-cresol, m-cresol, p-cresol, hydroquinone, catechol, resorcinol, guaiacol, pyrogallol, phlorogluinol, isopropylphenol, ethylphenol, propylphenol, t-butyl-phenol, isobutylphenol, octylphenol, nonylphenol, cumylphenol, p-phenylphenol, o-phenylphenol, m-phenylphenol, Bisphenol A, or dihydroxydiphenyl sulfone.

7. The resin formulation of claim 4, wherein the X moiety is further defined as either phenolic unit (F-2) or phenolic unit (F-3) according to the formulas:

(F-2)

(F-3)

8. The resin formulation of claim 4, wherein the silsesquioxane resin further comprises a fourth portion defined by structural units of $SiO_{4/2}$.

9. The resin formulation of claim 1, wherein the silsesquioxane resin component includes less than 10 mol. % of alkoxy and silanol functionality.

10. The resin formulation of claim 1, wherein the silsesquioxane resin component has a molecular weight ranging between 1,000 and 20,000 grams/mole.

11. The resin formulation of claim 1, wherein the cyanate ester component is a bisphenol cyanate ester.

12. The resin formulation of claim 3, wherein the cure accelerator is a metal acetylacetonate or metal octoate compound.

13. The resin formulation of claim 1, wherein the resin formulation further comprises a solvent.

14. A resin composite layer having a high glass transition temperature, the resin composite layer comprising:
a curable resin formulation; the resin formulation comprising:
a cyanate ester component; and
a silsesquioxane resin component having an equivalent weight of phenolic hydroxyl groups that is greater than 500 and less than 2,000 grams per mole of aromatic hydroxyl groups (g/eq. OH) and less than 10 mol. % of alkoxy and silanol functionality; the silsesquioxane resin component being present in an amount that is greater than 10 wt. % of the total solids content of the resin formulation;
wherein the resin composite layer exhibits a glass transition temperature that is greater than or equal to 185° C.

15. The resin composite layer of claim 14, wherein the resin composite layer is cured at a temperature greater than 175° C. for a predetermined amount of time.

16. The resin composite layer of claim 14, wherein the glass transition temperature exhibited by the resin composite layer decreases by less than or equal to 40% upon exposure to water at an elevated temperature for a predetermined amount of time.

17. The resin composite layer claim 14, wherein the silsesquioxane resin component in the resin formulation comprises $D^R$, $T^R$, $D^{RX}$, $M^{RRX}$, and Q structural units according to the formula:

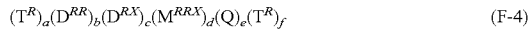
$$(T^R)_a(D^{RR})_b(D^{RX})_c(M^{RRX})_d(Q)_e(T^X)_f \qquad \text{(F-4)}$$

wherein $(T^R)_a$ represents structural units of $(R)SiO_{3/2}$; $(D^{RR})_b$ represents structural units of $(R)_2SiO_{2/2}$; $(D^{Rx})_c$ represents structural units of $(R)(X)SiO_{2/2}$; $(M^{RRX})_d$ represents structural units of $(R_2)(X)SiO_{1/2}$; $(Q)_e$ represents structural units of $SiO_{4/2}$; and $(T^X)_f$ represents structural units of $(X)SiO_{3/2}$;
wherein each R is independently selected to be a methyl group or an aryl group, and X is a moiety that includes at least one aromatic hydroxyl group;
wherein the subscripts a-f represent the mole percent of each structural unit according to the relationship (a+b+c+d+e+f)=1 with subscripts a and d being greater than zero.

18. The resin composite layer claim 14, wherein the silsesquioxane resin component in the resin formulation has a molecular weight ranging between 1,000 and 20,000 grams/mole.

19. The resin composite layer claim 14, wherein the resin composite layer is transparent.

20. The resin composite layer claim 14, wherein the resin composite layer exhibits a dielectric loss factor (tan δ) that is less than or equal to 0.0075 when measured at either 1 MHz or 10 MHz.

21. An electronic encapsulation system, the electronic encapsulation system comprising a resin composite layer, the resin composite layer being a cured resin formulation that comprises:
a cyanate ester component; and
a silsesquioxane resin component having an equivalent weight of phenolic hydroxyl groups that is greater than 500 and less than 2,000 grams per mole of aromatic hydroxyl groups (g/eq. OH) and less than 10 mol. % of alkoxy and silanol functionality; the silsesquioxane resin component being present in an amount that is greater than 10 wt.% of the total solids content of the resin formulation;
wherein the resin composite layer exhibits a glass transition temperature that is greater than 185° C. and adapted for use as part of an electronic device.

22. The electronic encapsulation system of claim 21, wherein the electronic device is a multilayer printed circuit board or a power semiconductor module.

23. The electronic encapsulation system claim 21, wherein the resin composite layer is a barrier layer that provides environmental or hermetic protection to the electronic device.

24. The electronic encapsulation system of claim 22, wherein the resin composite layer is compatible with copper metalization, polymer material, and glass fibers used in the construction of the multilayer printed circuit board.

25. The electronic encapsultion system of claim 24, wherein the polymer material is a phenolic, epoxy, polytetraethylene, polyimide, or polystyrene resin.

26. The electronic encapsulation system of claim 21, wherein the encapsulation system is a wafer level embedded package.

* * * * *